United States Patent
Vettori

(10) Patent No.: US 11,333,681 B2
(45) Date of Patent: May 17, 2022

(54) CANTILEVER PROBE HEAD AND CORRESPONDING CONTACT PROBE

(71) Applicant: Technoprobe S.p.A., Cernusco Lombardone (IT)

(72) Inventor: Riccardo Vettori, Cernusco Lombardone (IT)

(73) Assignee: Technoprobe S.p.A., Cernusco Lombardone (IT)

( * ) Notice: Subject to any disclaimer, the term of this patent is extended or adjusted under 35 U.S.C. 154(b) by 0 days.

(21) Appl. No.: 16/931,183

(22) Filed: Jul. 16, 2020

(65) Prior Publication Data

US 2020/0348336 A1 Nov. 5, 2020

Related U.S. Application Data

(63) Continuation-in-part of application No. PCT/EP2019/050837, filed on Jan. 14, 2019.

(30) Foreign Application Priority Data

Jan. 17, 2018 (IT) .................. 102018000001170

(51) Int. Cl.
   *G01R 1/067* (2006.01)
   *G01R 1/073* (2006.01)
   *G01R 31/00* (2006.01)
   *G01R 31/28* (2006.01)

(52) U.S. Cl.
   CPC ..... *G01R 1/06727* (2013.01); *G01R 31/2886* (2013.01)

(58) Field of Classification Search
   CPC ........ G01R 1/067; G01R 1/073; G01R 31/00; G01R 31/02; G01R 31/28; G01R 31/2889
   See application file for complete search history.

(56) References Cited

U.S. PATENT DOCUMENTS

| | | | |
|---|---|---|---|
| 6,956,389 B1 * | 10/2005 | Mai ................... | G01R 1/06727 324/754.07 |
| 2007/0069745 A1 * | 3/2007 | Lou .................... | G01R 1/06711 324/754.07 |
| 2009/0140760 A1 | 6/2009 | Narita et al. | |
| 2010/0182028 A1 | 7/2010 | Ni et al. | |
| 2010/0219854 A1 | 9/2010 | Kuniyoshi et al. | |
| 2011/0279139 A1 | 11/2011 | Lou et al. | |
| 2014/0009182 A1 * | 1/2014 | Nasu .................. | G01R 1/06727 324/754.11 |
| 2014/0015561 A1 | 1/2014 | Chang et al. | |

* cited by examiner

*Primary Examiner* — Neel D Shah
(74) *Attorney, Agent, or Firm* — Seed Intellectual Property Law Group LLP

(57) ABSTRACT

A cantilever probe head includes a support ring associated with a PCB board and a plurality of contact probes, protruding from the support ring in a cantilever manner and being held by a support associated with the support ring. Each contact probe has a rod-like body having a longitudinal axis inclined with respect to a reference plane corresponding to a plane of a wafer of devices under test by the cantilever probe head, as well as at least one first end portion, provided in a first probe section protruding from the support in the direction of the wafer of devices under test, the first end portion being bent with respect to the longitudinal axis starting from a bending point and ending with a contact tip of the contact probe able to abut onto a contact pad of a device under test of the wafer.

25 Claims, 7 Drawing Sheets

CANTILEVER PROBE HEAD AND CORRESPONDING CONTACT PROBE

BACKGROUND

Technical Field

The present disclosure refers to a cantilever probe head and to a corresponding contact probe.

The disclosure relates in particular, but not exclusively, to a probe head adapted to be installed in a testing apparatus for electrical testing devices integrated on semiconductor wafer and the following description is made with reference to this field of application with the only purpose to simplify its explanation.

Description of the Related Art

As it is well known, a probe head is a device being suitable to electrically connect a plurality of contact pads of a microstructure with corresponding channels of a testing apparatus performing the test thereof.

The test performed on integrated circuits is used to detect and isolate defective circuits already in the production step. Normally, probe heads are thus used to electrically test on-wafer integrated circuits before cutting and assembling them within a chip-containing package.

Widely used are the so called "cantilever" probe heads, i.e., probe heads comprising a plurality of probes which project in a cantilever manner from an appropriate support.

In particular, as schematically shown in FIG. 1, a cantilever probe head 10 normally comprises a support ring 11, for example made of aluminum, ceramic o another suitable material, associated with an integrated circuit board or PCB board 12. A support 13, normally made of resin, is associated with the support ring 11 and is suitable to incorporate a plurality of mobile contact elements or contact probes 14, which are normally composed of wires of special alloys with good electrical and mechanical properties and come out from the resin support 13 with a suitable angle α with respect to a reference plane, in particular the plane of a device under test 15, for example a wafer of integrated circuits to be tested with such contact probes 14. For this reason, such contact probes 14 are indeed recommended as cantilever probes.

In particular, the cantilever contact probes 14 have an end portion, usually called hook 14a, which is bent with an appropriate angle with respect to a probe body 14b. The hook 14a ends with a contact tip 16A adapted to abut onto a contact pad 15A of the device under test 15. The hooks 14a are then bent at a bending point 14c defined between the probe body 14b and the hook 14a, such that the hooks 14a result substantially orthogonal to the plane of the device under test 15.

The good connection between the contact tips 16A of the contact probes 14 of the cantilever probe head 10 and the contact pads 15A of the device under test 15 is ensured by the pressure of the cantilever probe head 10 on the device itself, the contact probes 14 vertically bending in the opposite direction to the device movement towards the cantilever probe head 10.

In particular, when the device under test 15 vertically moves against the hook 14a, as it happens during the normal operations of testing wafer of integrated circuits, the corresponding contact probe 14 bends in a direction which is substantially orthogonal to the plane of such device under test 15 and its bending point 14c runs an arch of a circle. A first probe section 18a protruding with respect to the resin support 13 in the direction of the device under test 15 defines thus a working arm for the contact probe 14 in its vertical bending movement and is commonly indicated with the term "free length."

The hook form of the cantilever contact probes 14 is such that, during the contact with the contact pads 15A of the device under test 15 and their travel upward or "overtravel" beyond a preset contact point, the hooks 14a move on contact pads 15A on the direction defined by the geometry of the system probe head-device under test, ensuring the so-called scrub of the contact tips 16A of the cantilever contact probes 14 on such contact pads 15A.

Each cantilever contact probe 14 further comprises a second probe section 18b protruding from the resin support 13 in the direction of the PCB board 12 and ending with a further end 16B of the contact probe 14 which is usually welded to the PCB board 12 at a weld 17.

In order to create such weld, the second probe section 18b could have a suitable size, in particular of the order of centimeters, i.e., at least double the usual dimensions of the devices under test 15 which are chips or dies of dimensions of 5 mm side; it is indeed usual to create the welds 17 manually, probe by probe, using microscope and tweezers.

Some space is thus provided to create the welds 17 and therefore the probe sections 18b protrude towards the PCB board 12; in particular, the overall dimensions of the cantilever probe head 10 increase by virtue of the space which has to be envisaged around the support ring 11 to create separate contacts i.e., separate welds 17 for each contact probe 14.

It is especially to be considered that, while the dimensions of the devices under test 15 in form of a chip or die are about 5 mm, the second probe section 18b to create the weld 17 should have a length of even centimeters (at least 10 mm=1 cm, i.e., double the dimension of the die).

It is moreover appropriate to note that the force exerted by each contact probe 14 onto the contact pad 15A of the device under test 15 depends on many factors, among which the main are: the kind of material the contact probe 14 is made of, its shape, the angle α of its contact hook 14a, the length of its first portion 18a protruding or free length and the overtravel of the device under test 15. These factors also determine the extent of the sliding of the contact hooks 14a on the contact pads 15A, i.e., the so-called "scrub."

It is also known in the art the use of support rings 11, generally made of aluminum, ceramic o another suitable material, having different shapes, depending on the set of contact pads 15A on which the test has to be performed, so as to make uniform the free length value of the contact probes 14 and therefore make uniform the value of the force they exert on the pads themselves, thus ensuring a uniformity of consumption and behavior of the whole cantilever probe head 10.

Cantilever probe heads of the above described type, which comprise welded probes are known for instance from the US Publications No. US 2010/0182028 to Ni et al. (KING YUAN ELECTRONICS CO LTD) and No. US 2011/0279139 A1 to Lou et al. (STAR TECHN INC). Moreover, US Publications No. US 2014/0009182 to Nasu et al. and No. US 2010/0219854 to Kuniyoshi et al. (NIHON MICRONICS KK) disclose a probe comprising a base portion having an attaching end and an arm portion extending from the base portion laterally and supporting a probe tip.

Different configurations for cantilever probe heads, in particular for high frequency applications, are also known from the US Publications No. US 2007/069745 to Lou et al. (STAR TECHN INC) and No. US 2014/0015561 to Chang et al. (MPI CORPORATION), wherein the cantilever probes are welded to a top surface of the PCT, opposite to a bottom surface facing a device to be testes.

Alternatively, it is possible to produce a probe head with vertical technology, as schematically shown in FIG. 2.

Such a vertical probe head, indicated with 20 as a whole, comprises a plurality of contact probes 21, normally made of wires of special alloys with good electrical and mechanical properties and kept by at least one pair of supports or guides substantially platelike and parallel to each other and extended in a direction which is substantially orthogonal to a plane defined by a device under test 25, usually shaped as a wafer of integrated circuits, as seen above.

In particular, the vertical probe head 20 comprises at least one lower platelike support, usually referred to as "lower die" or also simply lower guide 22, and one upper platelike support, usually referred to as "upper die" or also simply upper guide 23, having respective guiding holes 22A and 23A inside which at least one contact probe 21 slides through.

The probes and the guides are housed inside a case 24 and are placed at a certain distance from each other so as to let a free zone or air zone 24A for the movement and possible deformation of the contact probes 21; for this reason the zone 24A is also referred to as bending zone.

Each contact probe 21 ends with an end with a contact tip 21A intended to abut onto a contact pad 25A of the device under test 25, so as to create a mechanical and electrical contact between the device under test 25 and a testing apparatus (not shown) whose vertical probe head 20 forms an end element.

The term "contact tip" means here and below an end zone or region of a contact probe intended for the contact with the device to be tested or the testing apparatus, the end zone or region being not necessarily sharp.

In some cases, the contact probes 21 are secured to the head itself at the upper guide 23 in a fixed manner: it is the case of probe heads with blocked probes.

More frequently, however, probe heads are used with probes which are not blocked in a fixed manner, but held interfaced to a so-called board, possibly by means of a micro contacting plate: it is the case of probe heads with non-blocked probes. The micro contacting plate is usually called "space transformer" because, in addition to the contact with the probes, it also allows to spatially redistribute the contact pads provided on it, with respect to the contact pads which are on the device under test, in particular with a loosening of the distance constraints between the centers of the pads themselves.

In this case, as shown in FIG. 2, the contact probe 21 has a further contact tip, referred to as contact head 21B towards a pad 26B of a plurality of contact pads of a space transformer 26. A good electrical contact between probes 21 and space transformer 26 is always ensured by means of the contact heads 21B of the contact probes 21 abutting and pressing onto contact pads 26B of the space transformer 26, intended to interface to a PCB board, not shown.

In the example of FIG. 2, the contact probes 21 also comprise a pre-deformed portion 21C, adapted to aim bending of the probes during the pressing contact of the probe head onto the device under test 25.

In such case, therefore, the contact heads 21B of the contact probe 21 are floating and come in pressing contact with the contact pads 26B of the space transformer 26, which can be produced using different methods, for example according to the so-called direct attach, which envisages that the space transformer is directly obtained from the PCB board to which it is intended to be connected, or according to a bonding technology wherein the space transformer is physically separated from the PCB board and connected thereto by means of bonding wires.

The main advantage of the vertical technology is the possibility to test devices with closer contact pads, i.e., really narrow pitches and also pitches of full array type, i.e., with pads arranged on all the four sides.

Actually, since in the cantilever technology the tip have a tapered shape, the cantilever probe heads are in any case advantageous in terms of pitch, especially using a multilayer structure for the corresponding support ring and taking precisely advantage of the tapered shape of the tips for contacting really close pads, i.e., with reduced pitch.

According to the vertical technology, the distance between pads is limited by the diameter of the probe and by the capability to bring near the guiding holes provided in the guides. Here and below, with the definition "distance between pads" is meant the distance between the centers of symmetry of the pads.

With the current technologies, the probe heads produced with the vertical technology do not reach the pitches which are obtained with the cantilever probe heads.

The probe heads produced with vertical technology have on the contrary, with respect to the cantilever heads, the advantage that they manage to contact dies with high parallelisms, with contact tips which "copy" the pad distribution on the devices under test.

With the probe heads produced with cantilever technology some space is provided to create the welds and it is impossible to perform the simultaneous test of many dies in parallel, even if stratagems are known to remedy this inconvenience and to obtain higher parallelisms than the single one, for example to test two dies near each other, using steps to stagger the probes, or using probes arranged diagonally, without however reaching the performance of the vertical technology.

BRIEF SUMMARY

The cantilever probe head is able to create a parallel testing of different dies integrated on a wafer thanks to a modified its structure having a further bending point in the section of probe protruding from the resin support towards the PCB board to create a contact zone closer to the support itself, overcoming the need to provide an appropriate length to achieve the welding of the probe to the PCB board and the problems tied to the prior art solutions.

According to an aspect of the disclosure, the cantilever probe head comprises a support ring associated with a PCB board and a plurality of contact probes, protruding from such support ring in a cantilever manner and being held by a support associated with the support ring, each contact probe having a substantially rod-like probe body and a longitudinal axis inclined with respect to a reference plane corresponding to a plane of a wafer of devices under test by means of the cantilever probe head, as well as at least one first end portion, provided in a first probe section protruding from the support in the direction of the wafer of devices under test, the first end portion being bent with respect to the longitudinal axis starting from a bending point and ending with a contact tip of the contact probe adapted to abut onto a contact pad of a device under test of the wafer, characterized in that each of the contact probes further comprises a second end portion provided in a second probe section protruding from the support in the opposite direction with respect to the first probe section towards a PCB board, the second end portion being bent with respect to the longitudinal axis starting from a further bending point and ending with a further contact end of the contact probe adapted to abut onto a contact pad of the PCB board.

More particularly, the contact probe according to the disclosure comprises the following additional and optional features, considered singularly or, if necessary, combined one another.

According to another aspect of the disclosure, each of the contact probes can further comprise at least one damping portion provided at the first and/or second probe section.

More particularly, such at least one damping portion can be provided at the first probe section.

Furthermore, such at least one damping portion can be shaped as a pantograph portion connected to the first end portion and to the probe body at respective bending points.

Such at least one pantograph portion can comprise four sides having variable sections, arranged substantially as a parallelepiped and defining an empty space therein.

According to another aspect of the disclosure, such at least one damping portion can be provided at the second probe section.

In particular, such at least one damping portion can be shaped as a spring portion connected to the probe body at the further bending point and adapted to define the further contact end of the contact probe.

According to yet another aspect of the disclosure, the cantilever probe head can further comprise at least one support plate connected to the support ring and provided with holes suitable for the passage of the second end portions provided with the further ends of the contact probes.

More particularly, the support plate can be made of a suitable insulation material and be welded to the support ring.

Furthermore, according to another aspect of the disclosure, the second end portion of each contact probe can be bent with respect to the longitudinal axis so as to be substantially orthogonal to the reference plane corresponding to a plane of the PCB board.

According to another further aspect of the disclosure, the first end portions of the contact probes can have a tapered shape which allows an arrangement thereof on more levels.

Moreover, according to another aspect of the disclosure, the support ring, provided with the support plate and with the support, can be mounted in pressing contact with the PCB board so that the further ends of the end portions of the contact probes abut onto the contact pads of the PCB board.

According to yet another aspect of the disclosure, the cantilever probe head can comprise a plurality of modules, each provided with a support ring and with a support from which contact probes protrude, ending with first and second end portions, the modules having sizes which can be compared to those of a single device under test.

More particularly, the plurality of modules can be distributed so as to cover an area of the PCB board equal to that of the wafer of devices under test.

Moreover, each of the modules can comprise at least one contact portion, suitably provided with at least one hole adapted to house at least one fixing element.

Each of the modules can further comprise alignment pins having suitable shapes which are complementary to as many housings.

According to this aspect of the disclosure, the cantilever probe head can further comprise a support structure associated with the PCB board for housing the modules and provided with the housings for the alignment pins of the modules.

According to another aspect of the disclosure, the cantilever probe head can comprise contact probes having respective second probe sections protruding from the support and/or respective second end portions having a different size, so as to modify a distribution of the contact pads of the PCB board.

The cantilever contact probe according to the disclosure can comprise a probe body having a predetermined longitudinal axis intended to be inclined with respect to a reference plane corresponding to a plane of a wafer of devices under test when the contact probe is mounted in a support associated with a support ring of a cantilever probe head, the cantilever contact probe further comprising at least one first end portion, provided in a first probe section intended to protrude from the support in the direction of the wafer of devices under test, the first end portion being bent with respect to the longitudinal axis starting from a bending point and ending with a contact tip of the cantilever contact probe adapted to abut onto a contact pad of a device under test of the wafer, characterized in that it further comprises a second end portion provided in a second probe section intended to protrude from the support in a direction opposite with respect to the first probe section towards a PCB board, the second end portion being bent with respect to the longitudinal axis starting from a further bending point and ending with a further contact end of the cantilever contact probe adapted to abut onto a contact pad of the PCB board.

According to another aspect of the disclosure, the cantilever contact probe can further comprise at least one damping portion provided at the first and/or second probe section.

According to another aspect of the disclosure, the at least one damping portion can be provided at the first probe section.

In particular, such at least one damping portion can be shaped as a pantograph portion connected to the first end portion and to the probe body at respective bending points.

Moreover, such at least one pantograph portion can comprise four sides having variable sections, arranged substantially as a parallelepiped and defining an empty space therein.

According to another aspect of the disclosure, such at least one damping portion can be shaped as a spring portion connected to the probe body at the further bending point and adapted to define the further contact end of the contact probe.

Furthermore, according to another aspect of the disclosure, the first end portion can be bent with respect to the longitudinal axis so as to be substantially orthogonal to the reference plane of the wafer of devices under test when the contact probe is mounted in a support associated with a support ring of a cantilever probe head.

Finally, according to another aspect of the disclosure, the second end portion can be bent with respect to the longitudinal axis so as to be substantially orthogonal to the reference plane corresponding to a plane of the PCB board when the contact probe is mounted in a support associated with a support ring of a cantilever probe head.

The features and advantages of the cantilever probe head and contact probe according to the disclosure will be apparent from the following description of one embodiment thereof, given by way of a non-limiting example with reference to the attached drawings.

DETAILED DESCRIPTION

Figure 1:
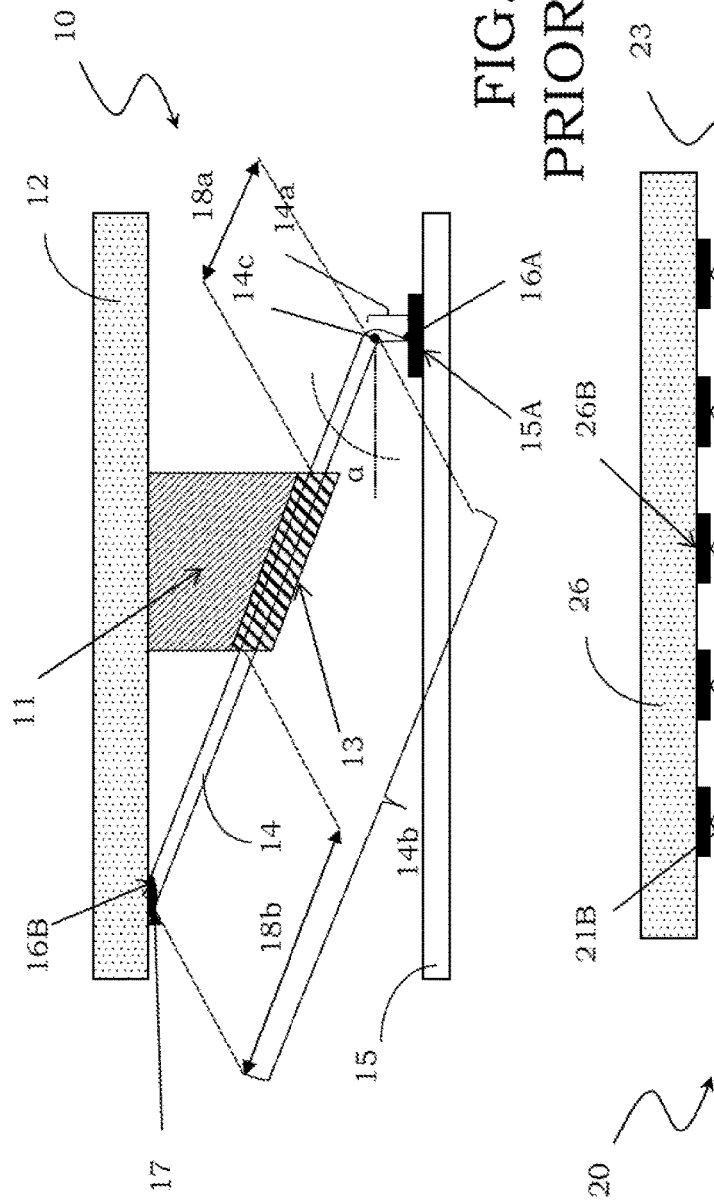
FIG. 1 schematically shows a sectional view of a cantilever probe head produced according to the prior art.
Figure 2:
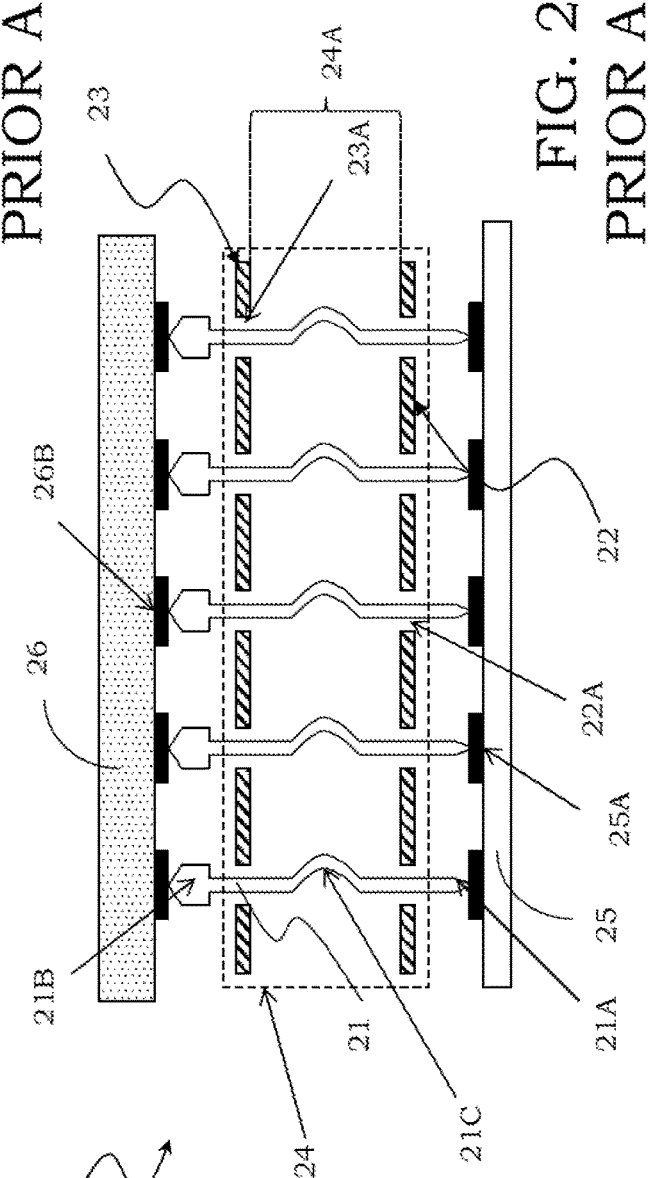
FIG. 2 schematically shows a sectional view of a vertical probe head produced according to the prior art.

With reference to these figures, and in particular to FIG. 3A, a probe head in cantilever technology is described, which is realized according to the present disclosure, hereinafter called cantilever probe head and referred to as a whole with 30.

It should be noted that the figures show schematic views of the probe head according to the disclosure and are not drawn to scale, but are instead drawn so as to emphasize the important features of the disclosure. Furthermore, in the figures, the different elements are shown in a schematic way, their shape being changeable depending on the needed application. It should be further noted that in the figures identical reference numerals refer to identical elements in shape or function. Finally, the different aspects shown by way of example in the figures can be obviously combined with each other and can be interchanged from one embodiment to another.

More particularly, the cantilever probe head 30 comprises a plurality of mobile contact elements or contact probes 31, protruding in a cantilever manner from a support ring 32, for example made of aluminum, ceramic or another suitable material, associated with an integrated circuit board or PCB board 33. In the example of FIG. 3A, only one contact probe 31 is shown for simplicity of illustration. Each contact probe 31 is normally made of wires of special alloys with good electrical and mechanical properties, suitable to ensure a good electrical contact to a test apparatus (not shown) by means of the PCB board 33.

As described in relation to the prior art, a support 34, normally made of resin, is associated with the support ring 32 and is suitable to incorporate the contact probes 31 which come out from the resin support 34 along a longitudinal axis HH inclined with a first angle $\alpha$ with respect to a reference plane $\pi$, in particular a plane of a device under test 35, for example a wafer of integrated circuits subjected to tests, each contact probe 31 protruding above the wafer as a kind of fishing rod, i.e., in a cantilever manner. In particular, the value of the first angle $\alpha$ can be between 0 and 30 degrees, preferably 15 degrees.

Conveniently, the cantilever contact probes 31 have an end portion, usually called hook 31a, which is bent with a second angle $\beta$ with respect to a probe body 31e which extends along the longitudinal axis HH. The hook 31a ends with a contact tip 36A of the contact probe 31 adapted to abut onto a contact pad 35A of the device under test 35. In particular, the value of the second angle $\beta$ can be between 90 and 120 degrees, preferably 105 degrees.

In a preferred embodiment, the second angle $\beta$ is set so that the hook 31a of each contact probe 31 is substantially orthogonal to the reference plane $\pi$ of the device under test 35, i.e., $\beta=90°+\alpha$, or also $\beta-\alpha=90°$.

As done in relation to the prior art, it is underlined that the term "tip" indicates an end zone or region of a contact probe not necessarily sharp.

The hook 31a is bent at a bending point PG1 defined in the probe body 31e itself, in particular in a first probe section 31b intended to protrude from the resin support 34 in the direction of the device under test 35 when the contact probe 31 is mounted in the cantilever probe head 30; the first probe section 31b defines thus a working arm for the cantilever contact probe 31 in its vertical bending movement during the contact of the cantilever probe head 30 on the device under test 35 in its normal operation and it is usually indicated with the term "free length."

In fact, as explained in relation to the prior art, the good connection between the contact pins 36A of the cantilever contact probes 31 and the contact pads 35A of the device under test 35 is ensured by the pressure of the cantilever probe head 30 onto the device itself, the cantilever contact probes 31 being subjected in that case to a bending in a direction orthogonal to the reference plane $\pi$ (i.e., in a direction Z as shown in the figure) in an opposite verse with respect to the movement of the device.

In particular, when the device under test 35 moves against the hook 31a, the corresponding cantilever contact probe 31 bends and its bending point PG1 runs an arch of a circle, while the contact tip 36A, with which the hook ends, moves along the reference plane $\pi$, in particular on a respective contact pad 35A, ensuring the so-called scrub of the surface of the pad.

Furthermore, the hook 31a has a tapered shape, which can be used, in particular in a multilayer structure, to contact pads 35A of the device under test 35 which are very close, i.e., with reduced pitch.

As it is well known to those skilled in the art, with "pitch" or distance between contact pads is meant the distance between the corresponding centers, meant as centers of symmetry of the interested pads.

Each cantilever contact probe 31 further comprises a second probe section 31d protruding from the resin support 34 in the direction of the PCB board 33. Also the second probe section 31d protrudes from the resin support 34 along the longitudinal axis HH. In the traditional cantilever contact probes 31, as explained above, the probe section protruding from the resin support in the direction of the PCB board continues in order to achieve a welding of the probe itself.

Conveniently, the cantilever contact probe 31 according to the present disclosure comprises instead a further bending point PG2 defined in the second probe section 31d, i.e., the section of the contact probe 31 intended to protrude from the resin support 34 in the direction of the PCB board 33 when the contact probe 31 is mounted in the cantilever probe head 30 and adapted to define an inclined end portion 31c which ends with a further end 36B, adapted to define a further contact tip of the cantilever contact probe 31. The end portion 31c forms with the longitudinal axis HH of the contact probe 31 a third angle $\gamma$, whose value can be from 15 to 90 degrees, preferably 75 degrees.

In a preferred embodiment, the third angle $\gamma$ is set so that also the end portion 31c is inclined substantially orthogonally with respect to the reference plane π, which corresponds also to a plane of the PCB board 33, usually arranged in parallel to the device under test 35, i.e., $\gamma=90°-\alpha$ or also $\gamma+\alpha=90°$. Thereby, also the second probe section 31d defines thus a working arm for the cantilever contact probe 31 when the end portion 31c is pushed against the PCB board 33, in particular during the assembly of the cantilever probe head 30.

It is underlined that the further contact end 36B of the contact probes 31 is in this case able to operate as contact end portion of the probes, such as for example a contact head of a vertical contact probe as described in relation to the prior art. Conveniently according to the present disclosure, as it will be better explained below, is thus possible to adopt the strategy of contact between probes and PCB board which are typical of the vertical technology.

More particularly, conveniently according to the present disclosure, the cantilever probe head 30 also comprises a support plate 37, provided with holes 37A suitable for the passage of the end portions 31c provided with the further ends 36B of the cantilever contact probes 31.

Figure 3A:
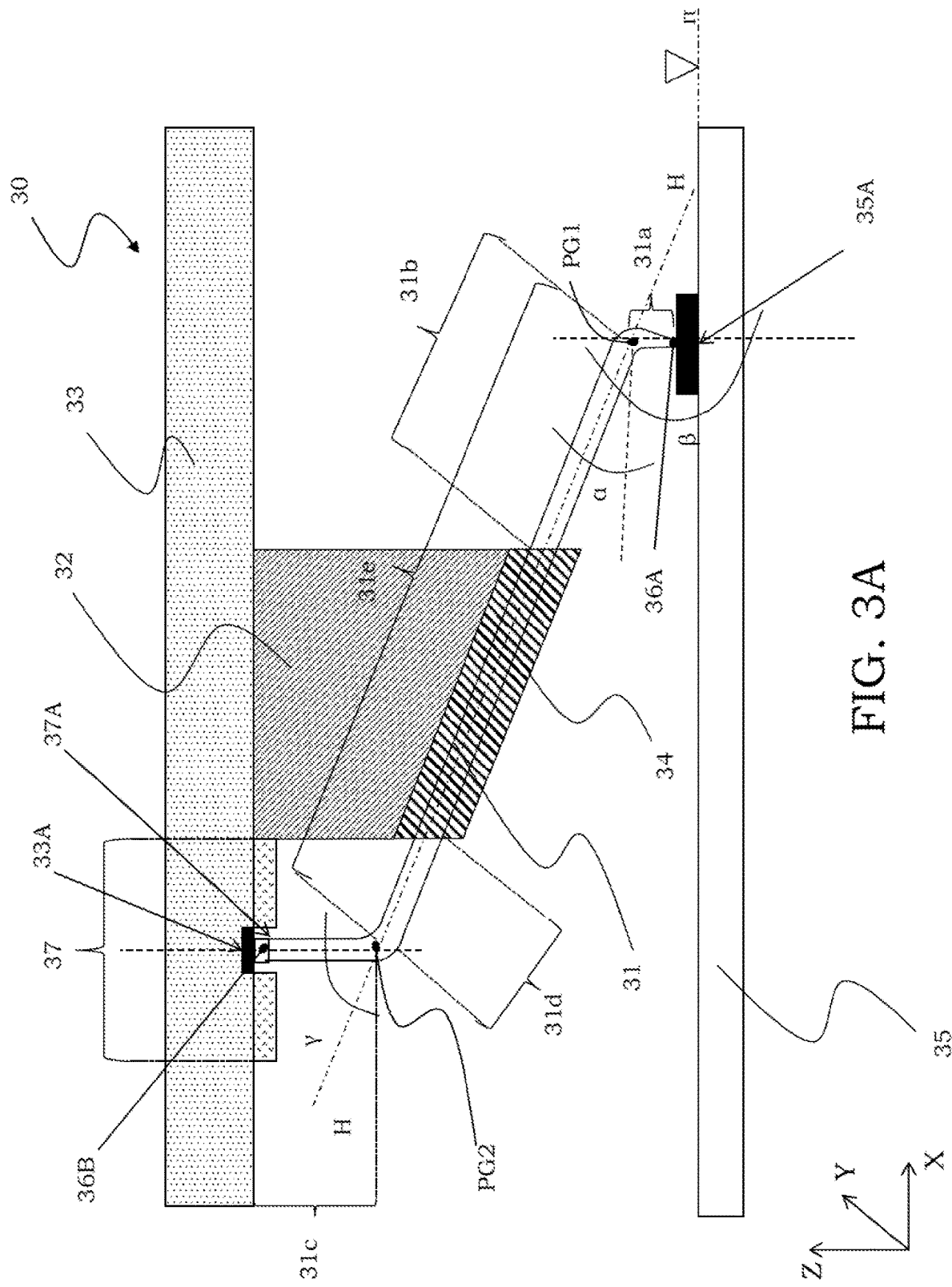
FIG. 3A schematically shows a sectional view of an embodiment of a cantilever probe head produced according to the present disclosure.

In the example shown in FIG. 3A, the support plate 37 is made of a suitable insulation material, such as ceramic o another suitable material, and connected or made integral, for example by welding, with the support ring 32; more particularly, the support plate 37 extends from the support ring 32 in a direction which is above the second section 31d of the contact probes 31.

The support plate 37 can be fixed to the PCB board 33.

It is underlined that, advantageously according to the present disclosure, the further contact end 36B of the contact probe 31 then directly contacts the PCB board 33, in particular with appropriate contact pads 33A created thereon, the corresponding end portion 31c being conveniently guided by the holes 37A of the support plate 37.

Thereby, thanks to the structure of the contact probe 31 provided with the further bending point PG2 in the second probe section 31d adapted to define the contact end portion 31c with the PCB board 33, it is possible to eliminate the bonding of the contact probe 31 to the PCB board 33, the contact to the PCB board 33 being instead created by the further end 36A of the contact probe 31 at the end portion 31c. In particular, the contact probe 31, and more particularly its end portion 31c, slides through the support plate 37 provided with holes 37A, in a manner equivalent to the contact heads of the probes in vertical technology and it is provided with a further end 36B adapted to the contact by means of pressure on the contact pads 33A of the PCB board 33.

It is moreover underlined that the contact probe 31 conveniently has an end portion or hook 31a which is tapered and bent on a respective contact pad 35A of the device under test 35, it is supported by the support ring 32, in particular made of metal, and it is sustained by the resin support 34, i.e., it maintains a cantilever base structure, for both the probe and the head as a whole.

The cantilever probe head 30 is in this case connected to the PCB board 33 with a method similar to the so-called "direct attach" of the vertical technology.

Furthermore, in their operation the hook 31a and the end portion 31c can be assimilated to two springs placed at opposite ends of the cantilever contact probe 31, i.e., at ends adapted to abut onto respective contact pads during the normal operation of the cantilever probe head 30, when abutting onto a device under test 25 and contacting the PCB board 33.

Figure 3B:
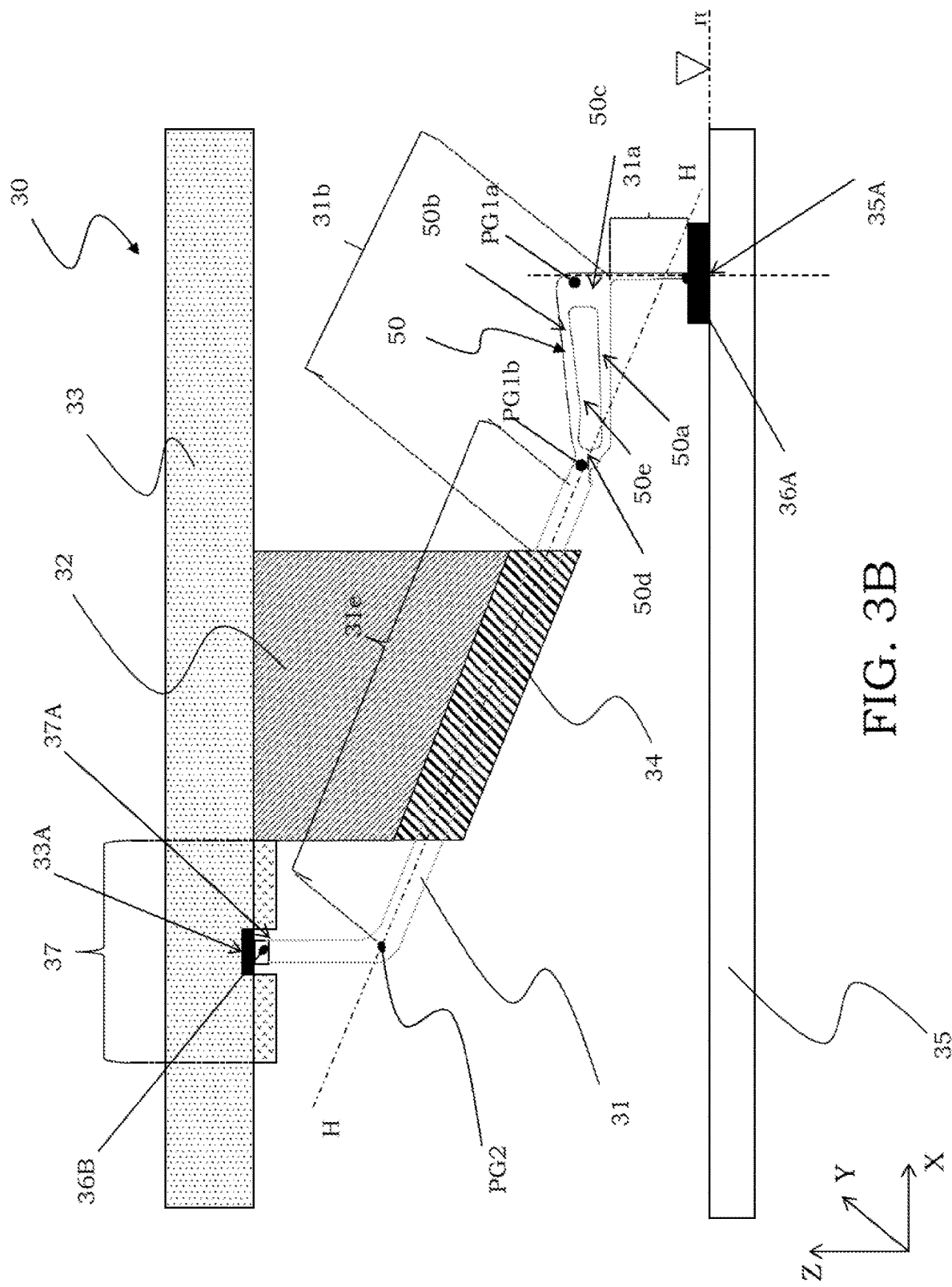
FIGS. 3B and 3C schematically show sectional views of alternative embodiments of a cantilever probe head produced according to the present disclosure.

According to an alternative embodiment which is schematically shown in FIG. 3B, the cantilever contact probe 31 further comprises a damping portion shaped as a pantograph portion 50 provided at the first probe section 31b.

More particularly, the pantograph portion 50 is connected to the hook 31a and to the probe body 31e at respective bending points PG1a and PG1b.

The pantograph portion 50 comprises four sides 50a-50d having variable sections, to distribute uniformly the stresses, arranged substantially as a parallelepiped and defining an empty space 50e therein. It is immediately clear that the pantograph portion 50 is able to provide a desired damping function during the pressing contact of the contact tip 36A of the cantilever contact probe 31 on the contact pad 35A of the device under test 35.

Figure 3C:
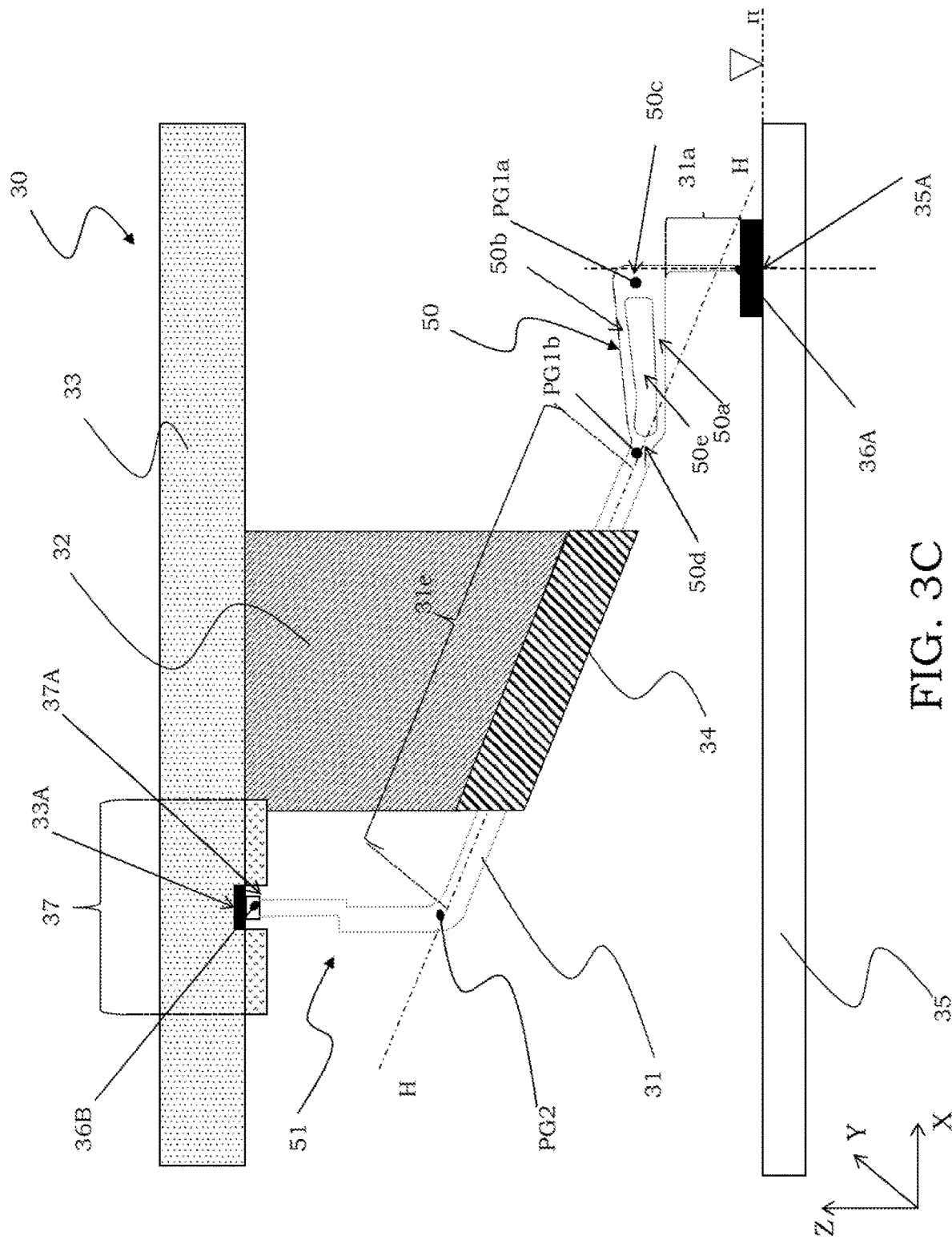

According to a further, preferred embodiment, which is schematically shown in FIG. 3C, the cantilever contact probe 31 can further comprise a further damping portion shaped as a spring portion 51, provided at the second probe section 31c. More particularly, the spring portion 51 is connected to the probe body 31e at the further bending point PG2 and defines the further end 36B suitable to the contact with the contact pads 33A of the PCB board 33.

In the example shown in FIG. 3C, the spring portion 51 is shaped as an elongated N. It is immediately clear that the spring portion 51 is able to provide a desired damping function during the pressing contact of the further end 36A of the cantilever contact probe 31 on the contact pads 33A of the PCB board 33.

It is obviously possible to realize cantilever contact probes 31 provided with the spring portion 51 and not of the pantograph portion 50.

Figure 4:
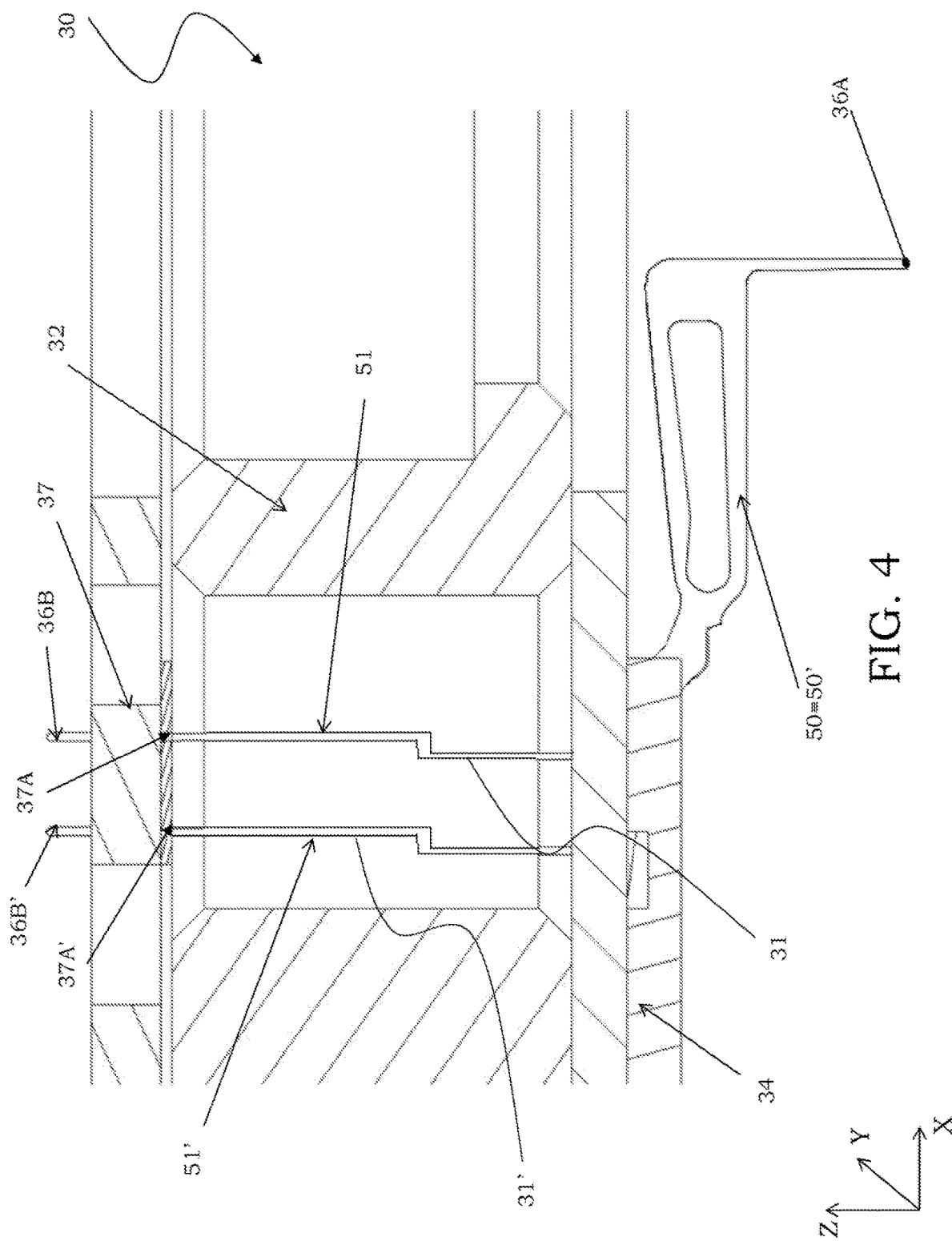
FIG. 4 schematically shows a sectional view of the cantilever probe head of FIG. 3C comprising at least one pair of contact probes.

It should be noted that the presence of the further bending point PG2 defined in the second probe section 31d which protrudes from the resin support 34 in direction of the PCB board 33 when the contact probe 31 is mounted in the cantilever probe head 30 allows to spatially distribute the further ends 36B of the contact probes 31, in particular according to the spatial distribution of the contact pads 33A of the PCB board 33, as schematically shown in FIG. 4, using as a non-limiting example the embodiment of the contact probes 31 of FIG. 3C. In particular, the ascending probe sections 31c with the spring portions 51 and thus the further ends 36B acting as contact heads of the contact probes 31 are then distributed on more rows, two in the figure, while the contact tips 36A are aligned in a single row, the pantograph portions 50 overlapping in the figure.

It is underlined that, thanks to the different size of the second probe sections 31d which protrude from the resin support 34, of the ascending probe sections 31c and possibly of the spring portions 51 provided therein, it is possible to modify the distribution of the contact pads 33A on the PCB board 33, also on more than two rows. It is thus possible to loosen the pitch constraints for the contact pads 33A of the PCB board 33 with respect to the contact pads 35A of the device under test 35.

It is thereby advantageously possible to obtain the contact between contact probes 31 and contact pads 33A of the PCB board 33 without the need of introducing an additional component, in particular a space transformer, as traditionally happens in vertical technology.

It is indeed well known that the distribution of the contact pads 33A of the PCB board 33 has much looser spatial constraints compared to the distribution of contact pads 35A of the device under test 35, and this can be copied using the cantilever probe head 30, comprising the cantilever contact probes 31 described above, provided with the further bending point PG2, without the use of additional component.

In particular, in FIG. 4, a cantilever probe head 30 is shown comprising at least one first contact probe 31 and a second contact probe 31' provided with respective bending points PG2 connected to respective spring portions 51, 51' adapted to define respective further ends 36B, 36B' conveniently shifted with respect to each other and therefore able to contact pad 33A of the PCB board 33 in different positions. More particularly, the second probe sections, i.e., the spring portions 51, 51', are conveniently housed in different holes 37A, 37A' of the support plate 37.

Figure 5:
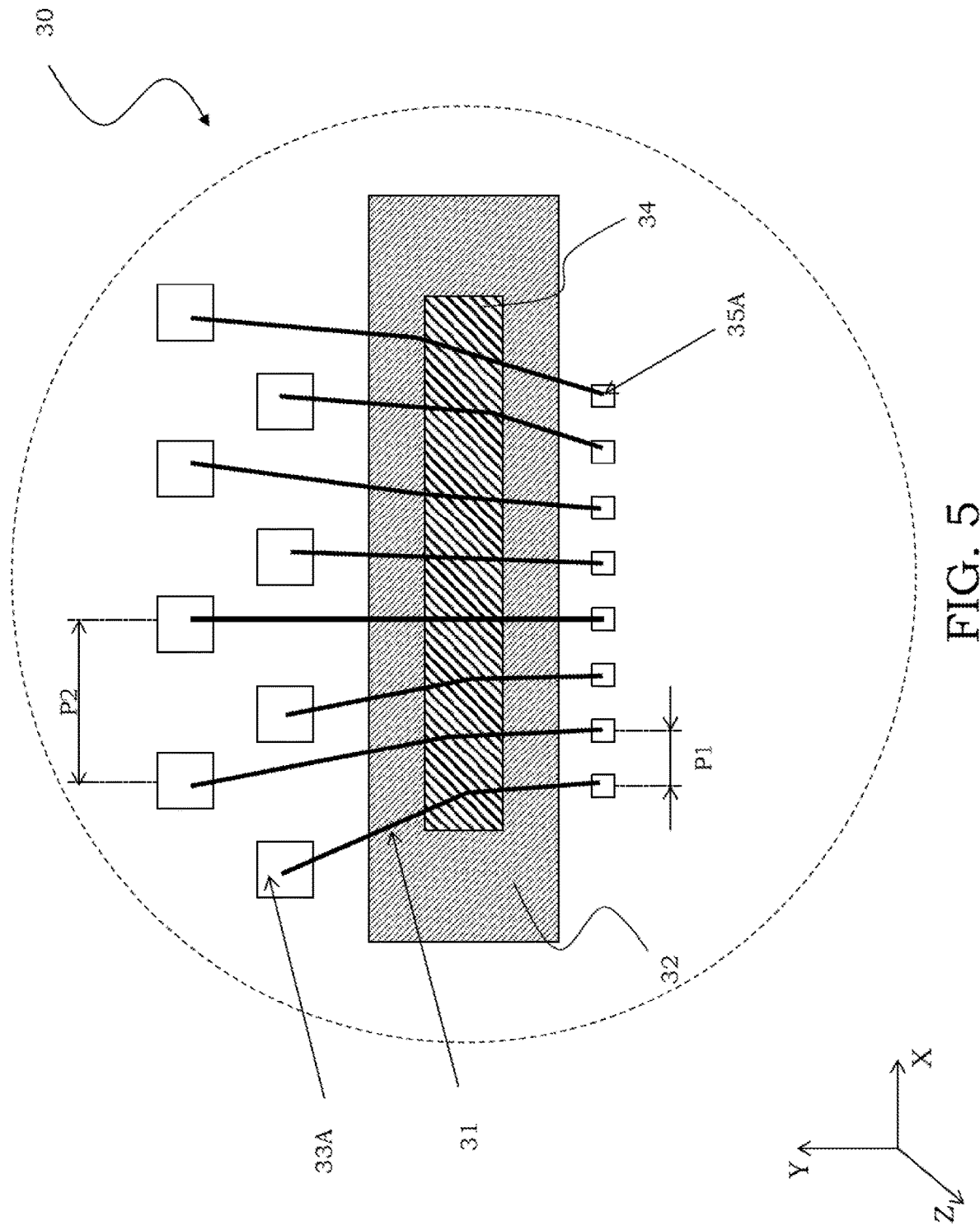
FIG. 5 schematically shows a top, plan view of the cantilever probe head of FIG. 3A-3C or 4.

The spatial redistribution of the further ends 36B of the contact probes 31 with respect to the corresponding contact tips 36A is further highlighted by the top, plan view of the cantilever probe head 30, with the PCB board 33 showing through, shown in FIG. 5. It is in particular clear in that figure that the configuration of the contact probes 31 provided with the further bending points PG2 allows to connect the contact pads 35A of the device under test 35 having a first distance or pitch P1 with the contact pads 33A of the PCB board 33 having a second distance or pitch P2, longer than the first pitch P1 (P2>P1), thereby obtaining a desired spatial transformation without the need to use additional components such as a space transformer.

It is also underlined that the combination of the support ring 32, provided with the support plate 37, and of the resin support 34 are conveniently pressed against the PCB board 33 in the assembling step, so as to ensure a contact of the end portion 31c, and in particular of the further contact portion 36B of the contact probes 31 with the contact pads 33A of the PCB board 33 during the normal operation of the probe head 30. The assembly in pressure can be obtained thanks to the presence of the further bending point PG2 which forms the end portion 31c, able to act as a spring during the pressing contact of the contact probes 31 mounted in the probe head 30, in particular when the support ring 32 provided with the support plate 37 abuts against the PCB board 33.

This effect is further ensured in case of contact probes 31 provided with the spring portion 51, as the ones shown in FIG. 3C.

It is underlined that the contact probes 31 are conveniently dimensioned so as to ensure a sufficient contact force of the corresponding contact tips 36A with which the hooks 31a on the contact pads 35A of the device under test 35 end. In particular, the force F exerted by each contact probe 31 is proportional to the arm provided by the probe portion protruding from the resin support 34 and is equal to:

$$F = E * D^4 / L^3 \quad (1)$$

wherein:

E is Young's modulus (or longitudinal elastic modulus);

D is the diameter of the contact probe 31, meant as the maximal dimension of its cross section; and L is the length of the first probe section 31b, which defines its arm (or free length).

Suitably according to the present disclosure, a similar force is exerted onto the PCB board 33 by the compression of the contact probe 31 also at the end portion 31c which, as above mentioned, substantially acts as a contact head portion of a probe in vertical technology.

Advantageously, in the preferred embodiment shown in FIG. 3C, the forces exerted onto the contact pads 35A of the device under test 35 and onto the contact pads 33A of the PCB board 33 are dampened thanks to the damping portions, in particular the pantograph portion 50 and the spring portion 51, provided at the first and second probe sections 31b and 31d of the cantilever contact probes 31 provided with the second bending point PG2.

As already indicated, the different positioning of the second bending point PG2 further allows to create an appropriate spatial transformation and to distribute the contact pads 33A of the PCB board 33, in particular by placing them at distances which are appropriate to their larger dimensions, as also shown in FIG. 5.

It is also underlined that, thanks to the contact between the end portions 31c of the contact probes 31, at the further ends 36B, and the contact pads 33A of the PCB board 33 created at the time of the assembly of the cantilever probe head 30 and in particular thanks to the pressure of the support ring 32 provided with the support plate 37 on the PCB board 33, the cantilever probe head 30 according to the present disclosure allows also to overcome a negative aspect of the vertical technology, i.e., the fact that the contact of the head end portions of the vertical probes with the PCB board is floating and should be recreated every time, at each contact (touch) of the respective tip portions onto the contact pads of the device under test.

In other words, in the cantilever probe head 30 according to the present disclosure the contact between the end portions 31c of the contact probes 31 onto contact pads 33A of the PCB board 33 is ensured also in the absence of a contact of the respective hooks 31a on the contact pads 35A of the device under test 35.

Moreover, on the basis of the features of the contact probes and of the cantilever probe head according to the present disclosure, it is possible to solve an additional technical problem, in particular with a preferred embodiment of the cantilever probe head 30.

The configuration of the cantilever contact probes 31 provided with the further bending point PG2 and the contact under pressure of the further end 36B on the PCB board 33 allows in fact to produce a probe head in a modular way. More particularly, such a modular probe head comprises a PCB board 33 and a plurality of modules 40, each provided with a support ring 32 and with a resin support 34 from which contact probes 31 protrude, which end on one side with the hooks 31a and on the other with the end portions 31c, the latter being in particular conveniently guided by the holes 37A provided in the support plate 37 made integral with the support ring 32. Each module 40 has then the features of a cantilever probe head 30 as described above, but it is produced with sizes which can be compared, in particular only slightly larger, to those of a single device under test 35, wherein "which can be compared" means that the area occupied by a module 40 is equal to the area occupied by a device under test 35 or larger than that for a value which is up to 50% higher, preferably equal to 20% higher.

The plurality of modules 40 is in particular arranged so as to extend over an area corresponding to an area of a chip wafer comprising the devices under test, equivalent to a usable surface of the PCB board, thereby providing a modular probe head suitable for parallel testing more devices.

More particularly, the PCB board 33 is provided with an appropriate support structure or metal housing for housing the modules 40.

Suitably, such a modular probe head, comprising the plurality of modules 40 associated to the PCB board 33, has the advantage to allow the replacement of the modules singularly, in case of damage, which replacement is possible thanks to the contact performed by the contact probes 31 at their further end 36B onto the contact pads 33A of the PCB board 33 without the need of welding wires, in a similar way to the so-called "direct attach" of the vertical technologies.

Figures 6A, 6B:
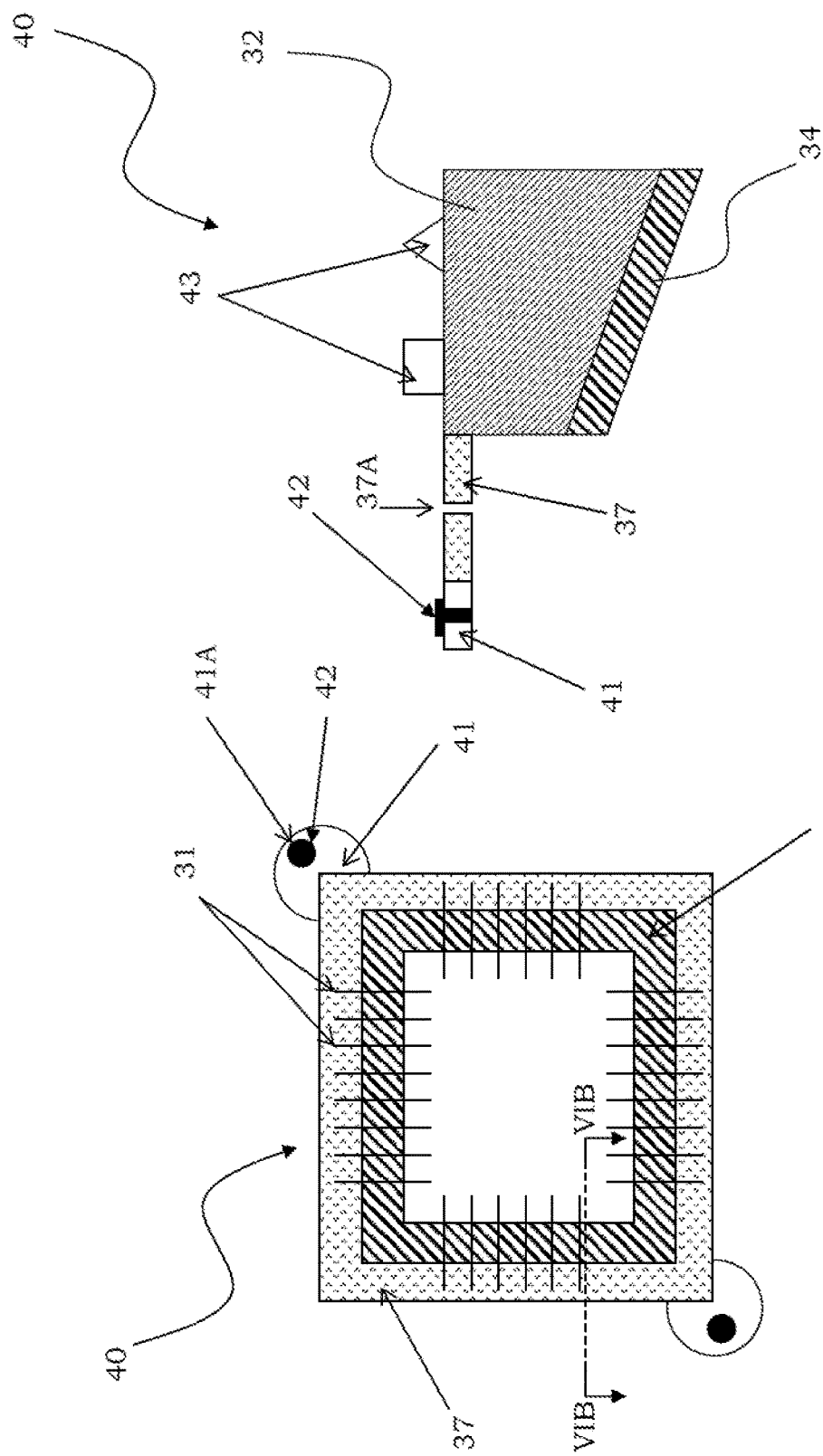
FIGS. 6A and 6B schematically show respective plan and lateral views of the probe head produced according to the present disclosure in a modular way.

More particularly, as shown in FIGS. 6A and 6B, each module 40 comprises at least one contact portion 41, suitably provided with at least one hole 41A, in particular threaded, adapted to house at least one fixing element, in particular a screw 42, thanks to the screwing of which the module 40 is made integral or fixed to the support structure of the PCB board 33 or directly to the PCB board itself.

In a preferred embodiment, shown in FIG. 6A, each module 40 is provided with at least one pair of contact portions 41 arranged along the support ring 32 provided with the support plate 37, in particular at opposite angles of the support ring 32 being substantially squared.

It is also possible, as it is schematically shown in FIG. 6B, to provide each module with alignment elements or pins 43 having suitable shapes which are complementary to as many housings (not shown) prearranged in the support structure of the PCB board 33, so as to ensure a correct positioning of each module 40 with respect to the PCB board 33 and to facilitate its replacement.

More particularly, the alignment pins 43 can be shaped as small cylinders or pyramids protruding from the support ring 32 in the direction of the PCB board 33, adapted to find their place in suitable housings of the support structure of the PCB board 33 with a limited clearance, for example less than 10 microns, so as to ensure an accurate assembly of each module 40, thanks to the coupling between housings and alignment pins 43.

The support structure or metal housing is also conveniently provided with suitable contact points for the alignment with the PCB board 33.

It is underlined that a modular contact head comprising the plurality of modules 40 has the further advantage of making possible to replace only a portion thereof, for example in case of damage, so far an exclusive advantage of the vertical technology which, having so-called floating contact probes, allows a replacement of one or more damaged probes by simply pulling them out. Conveniently, the replaceable portion, corresponding to one or more modules 40, is then smaller than the whole probe card i.e., than a wafer of devices under test, thus reducing the maintenance cost of the probe card itself, which is particularly desired in so-called low cost or mass production fields such as the memory testing field.

Thanks to the use of modules 40 provided of suitable contact portions 41 which allow fixing, for example by screwing, to the support structure of the PCB board 33, the operations of replacement of a damaged portion become even simpler than the replacement of one or more probes of the heads produced in vertical technology. In conclusion, the contact head produced thanks to the cantilever contact probes provided with at least one further bending point in a portion of the probe body intended to protrude from the support ring in the direction of the PCB board as explained above allows to combine the advantages of the cantilever technology, maintaining its basis structure, to the ones of the vertical technology, with contacts obtained without welding and without the need to use much larger areas with respect to the overall dimensions of the support ring, to which only the support plate is made integral.

In particular, it is underlined that such a probe head is certainly not expensive, both at manufacture time, thanks to the reduced costs of cantilever technology, and during the life of the probe head, thanks to the use of singularly replaceable modules. Furthermore, thanks to the configuration of the contact probes, it is possible to easily modify the distance or pitch of the contact pads of the PCB board; it is in fact sufficient to "open" as a fan the second probe sections ending with the end portions and with the further ends, simply modifying their length, to be able to realize on the PCB board even very large and very distant contact pads.

Accordingly, it is possible to decrease also the cost of the PCB board, which is tied to the density or pitch and dimension of its pads indeed.

It is also underlined that the probe head produced according to the present disclosure becomes itself a space transformer, which allows to further reduce the cost of the PCB board, the most relevant cost for the testing apparatuses and tied, as above mentioned, to the density or pitch and dimensions of the contact pads indeed.

Furthermore, the presence of damping portions at one or more end probe sections allows to improve the contact of the corresponding end portions onto contact pads of the device under test or of the PCB board.

Finally, the construction of the cantilever probe head according to the present disclosure in a modular way ensures the possibility to replace only the damaged head portions, corresponding to one or more modules.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A cantilever probe head, comprising:
   a support ring;
   a PCB board connected to the support ring;
   a support connected to the support ring;
   a plurality of contact probes protruding from the support ring in a cantilever manner and being held by the support connected to the support ring; and
   each contact probe having a rod-like probe body with a longitudinal axis inclined with respect to a reference plane corresponding to a plane of a wafer of devices under test by the cantilever probe head and including:
      a first probe section protruding from the support in a direction of the wafer of devices under test and having at least one first end portion;
      a second probe section protruding from the support in an opposite direction with respect to the first probe section towards the PCB board and having a second end portion;
      a contact tip configured to abut onto a contact pad of a device under test of the wafer;
      a further contact end adapted to abut onto a contact pad of the PCB board;
      the first end portion being bent with respect to the longitudinal axis starting from a bending point and ending with the contact tip; and
      the second end portion being bent with respect to the longitudinal axis starting from a further bending point and ending with the further contact end, wherein the support ring and the support are mounted in pressing contact with the PCB board and the further contact ends of the second end portions of the contact probes abut in a pressing contact onto the contact pads of the PCB board.

2. The cantilever probe head of claim 1, wherein each of the contact probes further comprises at least one damping portion realized at the first probe section or at the second probe section.

3. The cantilever probe head of claim 2, wherein the at least one damping portion is realized at the first probe section.

4. The cantilever probe head of claim 3, wherein the at least one damping portion is shaped as a pantograph portion connected to the first end portion and to the probe body of the contact probe at respective bending points.

5. The cantilever probe head of claim 4, wherein the at least one pantograph portion comprises four sides having variable sections, arranged as a parallelepiped and defining an empty space therein.

6. The cantilever probe head according to claim 2, wherein the at least one damping portion is realized at the second probe section.

7. The cantilever probe head of claim 6, wherein the at least one damping portion is shaped as a spring portion connected to the probe body at the further bending point and defines the further contact end of the contact probe.

8. The cantilever probe head of claim 1, further comprising:
   at least one support plate connected to the support ring; and
   holes in the support plate for the passage of the second end portions with the further contact ends of the contact probes.

9. The cantilever probe head of claim 8, wherein the support plate is made of an insulation material and is welded to the support ring.

10. The cantilever probe head of claim 1, wherein the second end portion of each contact probe is bent with respect to the longitudinal axis and is orthogonal to the reference plane corresponding to a plane of the PCB board.

11. The cantilever probe head of claim 1, wherein the first end portions of the contact probes have a tapered shape and the contact probes are allowed to be arranged on different levels.

12. The cantilever probe head of claim 1, further comprising:
   a plurality of modules, each module being provided with:
      a support ring; and
      a support from which contact probes protrude;
   the contact probes ending with first end portion and the second end portion; and
   the modules having an area with a value being equal to or 50% higher than of the value of an area occupied by a device under test of the wafer of device under test.

13. The cantilever probe head of claim 12, wherein the plurality of modules are distributed to cover an area of the PCB board equal to an area of the wafer of devices under test.

14. The cantilever probe head of claim 12, wherein each of the modules comprises at least one contact portion, being provided with at least one hole adapted to house at least one fixing element.

15. The cantilever probe head of claim 12, wherein each of the modules further comprises alignment pins having shapes which are complementary to as many housings.

16. The cantilever probe head of claim 15, further comprising a support structure connected to the PCB board for housing the modules and provided with the housings for the alignment pins of the modules.

17. The cantilever probe head of claim 1, further comprising contact probes having respective second probe sections protruding from the support or respective second end portions having a different size, to modify a distribution of the contact pads of the PCB board.

18. A cantilever contact probe, comprising:
   a probe body having a predetermined longitudinal axis able to be inclined with respect to a reference plane corresponding to a plane of a wafer of devices under test when the contact probe is mounted in a support associated with a support ring of a cantilever probe head;
   a first probe section configured to protrude from the support in the direction of the wafer of devices under test;
   a second probe section configured to protrude from the support in a direction opposite with respect to the first probe section towards a PCB board;
   at least one first end portion realized in the first probe section;
   a second end portion realized in the second probe section;
   the first end portion being bent with respect to the longitudinal axis starting from a bending point and ending with a contact tip of the cantilever contact probe configured to abut onto a contact pad of a device under test of the wafer; and
   the second end portion being bent with respect to the longitudinal axis starting from a further bending point and ending with a further contact end of the cantilever contact probe configured to abut onto a contact pad of the PCB board when the support ring and the support are mounted in pressing contact with the PCB board.

19. The cantilever contact probe of claim 18, further comprising at least one damping portion realized at the first probe section or at the second probe section.

20. The cantilever contact probe of claim 19, wherein the at least one damping portion is realized at the first probe section.

21. The cantilever contact probe of claim 20, wherein the at least one damping portion is shaped as a pantograph portion connected to the first end portion and to the probe body at respective bending points.

22. The cantilever contact probe of claim 21, wherein the at least one pantograph portion comprises four sides having variable sections, arranged as a parallelepiped and defining an empty space therein.

23. The cantilever contact probe of claim 19, wherein the at least one damping portion is shaped as a spring portion connected to the probe body at the further bending point and defines the further contact end of the contact probe.

24. The cantilever contact probe of claim 18, wherein the first end portion is bent with respect to the longitudinal axis being orthogonal to the reference plane of the wafer of devices under test when the contact probe is mounted in a support associated with a support ring of a cantilever probe head.

25. The cantilever contact probe of claim 18, wherein the second end portion is bent with respect to the longitudinal axis so as to be orthogonal to the reference plane corresponding to a plane of the PCB board when the contact probe is mounted in a support associated with a support ring of a cantilever probe head.

* * * * *